United States Patent
Vail et al.

(10) Patent No.: US 9,960,593 B2
(45) Date of Patent: May 1, 2018

(54) SINGLE EVENT LATCHUP (SEL) CURRENT SURGE MITIGATION

(71) Applicant: HARRIS CORPORATION, Melbourne, FL (US)

(72) Inventors: David Vail, West Melbourne, FL (US); David Diedling, Rockledge, FL (US); William Boesch, West Melbourne, FL (US); Joshua P. Bruckmeyer, West Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 262 days.

(21) Appl. No.: 14/814,699

(22) Filed: Jul. 31, 2015

(65) Prior Publication Data

US 2017/0033554 A1  Feb. 2, 2017

(51) Int. Cl.
*H02H 9/02* (2006.01)
*H02H 3/10* (2006.01)
*H02H 5/00* (2006.01)
*H02H 3/087* (2006.01)
*G01R 31/3181* (2006.01)
*H02H 3/05* (2006.01)

(52) U.S. Cl.
CPC ......... *H02H 9/02* (2013.01); *G01R 31/31816* (2013.01); *H02H 3/087* (2013.01); *H02H 3/10* (2013.01); *H02H 5/005* (2013.01); *H02H 3/05* (2013.01)

(58) Field of Classification Search
CPC ............ H02H 9/02; H02H 3/087; H02H 3/10; H02H 5/005; H02H 3/05; G01R 31/31816
See application file for complete search history.

(56) References Cited

U.S. PATENT DOCUMENTS

| | | | | |
|---|---|---|---|---|
| 5,672,918 | A | * | 9/1997 | Kimbrough ............ H02H 5/005 250/389 |
| 5,923,830 | A | | 7/1999 | Fuchs et al. |
| 6,799,288 | B2 | | 9/2004 | Kohnen et al. |
| 7,310,211 | B2 | | 12/2007 | Gruber et al. |
| 7,343,579 | B2 | | 3/2008 | Coxe et al. |
| 7,466,181 | B2 | | 12/2008 | Hynes |

(Continued)

OTHER PUBLICATIONS

Becker, Heidi N. et al., Latent Damage in CMOS Devices From Single-Event Latchup, IEEE Transactions on Nuclear Science, vol. 49, No. 6, Dec. 2002, 3009-3015.

(Continued)

*Primary Examiner* — Zeev V Kitov
(74) *Attorney, Agent, or Firm* — Fox Rothschild LLP; Robert J. Sacco; Carol E. Thorstad-Forsyth (57) ABSTRACT

Method and system for Single Event Latchup (SEL) current surge mitigation involves monitoring data signals for a protected device and deriving from them a detected signature comprised of one or more detected signature vector components. The detected signature vector components are compared to previously stored signature vector components. Based on the comparing, the system selectively differentiates between the occurrence of standard power surges associated with normal operation of the protected device, and a non-standard current surge which requires cycling power of the protected device for continued proper functioning of the protected device.

20 Claims, 4 Drawing Sheets

(56) References Cited

U.S. PATENT DOCUMENTS

| | | | |
|---|---|---|---|
| 7,492,560 B2 | 2/2009 | Hussein et al. | |
| 8,378,696 B2 | 2/2013 | Buard et al. | |
| 8,685,800 B2 | 4/2014 | Yang et al. | |
| 8,896,978 B2 | 11/2014 | Baumann | |
| 9,659,721 B1* | 5/2017 | Sastry | H01H 9/54 |
| 2004/0145242 A1* | 7/2004 | Rodriguez | H02M 3/285 307/11 |
| 2008/0151456 A1* | 6/2008 | Julicher | G06F 1/28 361/93.4 |

OTHER PUBLICATIONS

Dodds, N.A. et al., SEL-Sensitive Area Mapping and the Effects of Reflection and Diffraction From Metal Lines on Laser SEE Testing, IEEE Transactions on Nuclear Science, vol. 60, N. 4, Aug. 2013, 2550-2558.

Gokhale, Maya et al., Dynamic Reconfiguration for Management of Radiation-Induced Faults in FPGAs, Proceedings of the 18th International Parallel and Dsitributed Processing Symposium (IPDPS'04), IEEE, 2004 (6 pages).

Maurer, Richard H. et al, Harsh Environments: Space Radiation Environment, Effects, and Mitigation, Johns Hopkins APL Technical Digest, vol. 28, No. 1 (2008) 17-29.

Stamenkovic, Z. et al., Design Flow and Techniques for Fault-Tolerant ASIC, 2013 20th IEEE International Symposium on the Physical and Failure Analysis of Integrated Circuits (IPFA), 93-98.

* cited by examiner

SINGLE EVENT LATCHUP (SEL) CURRENT SURGE MITIGATION

BACKGROUND OF THE INVENTION

Statement of the Technical Field

The inventive arrangements relate to single event latchup (SEL) current surge mitigation techniques, and more particularly to adaptive methods and systems that facilitate the use of certain types of electronic devices in environments where they would otherwise be vulnerable to power surge problems.

DESCRIPTION OF THE RELATED ART

The operation of integrated circuits can be temporarily or permanently disrupted due to single event effects associated with exposure to energetic particles such as protons and heavy ions. These events can occur through various mechanisms including one which is known as single event latch-up (SEL). An SEL event can occur when a dense track of electron-hole pairs produced in a silicon die by an energetic ion triggers certain parasitic circuit elements that form a Silicon Controlled Rectifier (SCR) in the integrated circuit. If this parasitic SCR circuit is triggered, the resulting SEL current may damage or destroy the integrated circuit, unless the SEL current is properly limited or promptly removed. An SEL event can be caused by a single energetic ion depositing an electric charge in a sensitive location of an integrated circuit die. A more detailed discussion of the SEL problem and a parasitic SCR circuit which can result therefrom is discussed in U.S. Pat. No. 8,685,800. Another source that is useful for understanding SEL is "SEL-Sensitive Area Mapping and the Effects of Reflection and Diffraction From Metal Lines on Laser SEE Testing", by N. Dodds et al, IEEE Trans Nuc Sci, August 2013.

An SEL can occur between the power rails of an integrated circuit or any other location where the device includes the required parasitic structure. Accordingly, the SEL can be destructive if the resulting current draw within an integrated circuit is sufficient to damage the junction and or a wire bond which is associated with the device. SEL can cause latent internal damage that can subtlety degrade device reliability, which discourages the use of SEL-prone parts even if obvious device damage is not apparent. These types of subtle degradations are described in the paper "Latent Damage in CMOS Devices From Single-Event Latchup", by Becker, Miyhira, and Johnston (all from NASA-JPL), IEEE Trans on Nuc Sci, December 2002. Accordingly, the use of integrated circuits which are vulnerable to SEL is severely restricted in applications such as space programs where exposure to energetic ions is anticipated.

Various methods have been proposed for addressing the problem of single event latch-up detection in a circuit. Some of these systems rely on ion detection circuits to signal an SEL event. However, the fact that an ion impacts a detector does not provide information about ions hitting sensitive areas and causing a single event latchup. Other systems rely on detection of an overcurrent to signify an SEL event has occurred. For example, such a system is described in U.S. Pat. No. 7,492,560. But a simple current-limiting regulator does not address the problem of how to decide when a given current surge corresponds to SEL, nor does it solve the problem of SEL currents that are less than the maximum operating current for a device.

In order to enhance the detection of relatively small current variations produced by SEL, there is described in U.S. Pat. No. 7,310,211 a system in which an electronic circuit is subdivided into smaller groups of active circuit components which each draw a similar amount of current. By subdividing the electronic circuit in this way, an overcurrent caused by SEL in any one of the subdivided groups of active circuit components is more reliably distinguished. However, this approach is impractical when utilizing existing commercial off-the-shelf integrated circuit devices in which power cannot be internally subdivided. It also fails to address the importance of extremely fast detection of SEL events and fast response times, which are key for purposes of preventing damage to electronic circuits when SEL does occur.

Some commercial products are available to protect circuits from occurrences of SEL. For example, a conventional product for this purpose can include a current threshold comparator which is used to control a switch. The switch can include a series FET switch and a bipolar transistor crowbar circuit to control current to a protected device. When a current level exceeds a preset level, a power supply voltage is disconnected from the load (e.g., an integrated circuit device). Conventional devices used for this purpose are known make use of an FET power switch in series with the load. Still, such commercially available products do not discriminate between a "normal" power transient and a true "SEL" transient.

SUMMARY OF THE INVENTION

Embodiments of the invention concern a method for damage protection from SEL events. The method involves monitoring a plurality of signature vectors for a protected device. Each "signature vector" is defined here to be a set of one or more distinguishing characteristics which can potentially be used to distinguish between an SEL condition and normal operation. Accordingly, exemplary signature vectors can include (1) SEL current signal characteristics and features, (2) system state information (3) the logical state of the protected device, and/or (4) environment information. Each signature vector can be comprised of one or more signature vector components. For example, an SEL current signal type of signature vector could include signature vector components such as current magnitude and current rate of change.

A detected signature is derived from the plurality of signature vectors. The detected signature is comprised of a plurality of detected signature vector components that are associated with the plurality of signature vectors. The method also involves comparing the plurality of detected signature vector components to a plurality of predetermined signature vector components associated with at least one current surge signature. Based on the comparing, a determination is made to selectively differentiate between the occurrence of standard power surges associated with normal operation of the protected device and a non-standard current surge which requires cycling power of the protected device (or in some cases a particular power input bus) for continued proper functioning of the protected device. The method also involves selectively cycling the power applied to the protected device based on the results of the comparing step.

The invention also concerns a current surge mitigation system for ensuring reliable operation of a protected device, where the protected device is one that has a vulnerability to SEL, which can result in excessive power draw. The system also includes an adaptive current control circuit which monitors a plurality of signature vectors for the protected device and derives from the plurality of signature vectors a detected signature which is comprised of a plurality of detected signature vector components. A sensing circuit is provided which senses a magnitude of a power supply electric power current supplied to the protected device and communicates at least one said signature vector to the adaptive current controller which is representative of the current-versus-time waveform of a current transient. The adaptive current control circuit evaluates the plurality of detected signature vector components and the state of the system to detect the occurrence of SEL.

According to one aspect, the adaptive current control unit compares the detected information to information contained in a data store. The information contained in the data store can include information specifying a plurality of previously stored signature vector component data values associated with at least one current surge signature. Based on the comparing, the control circuit selectively differentiates between the occurrence of a standard current surge associated with normal operation of the protected device and a non-standard current surge which requires cycling power of the protected device for continued proper functioning of the protected device. The system can also include at least one output circuit of which selectively generates a trigger signal for cycling the power applied to the protected device (or in some cases a particular power input bus) when a non-standard current surge is identified.

The adaptive aspect of the invention allows current transient characteristics to be measured and recorded during system test, and optionally during on-orbit operation. This adaptive feature can be used to "train" the logic to recognize normal (but rare) current transients that may occur for example, at high operating temperatures or in combination with other system events. During normal pre-launch system checkout, any unusual current transients which do not match with the existing event signatures in the event data store can be recorded and reported, to optionally be added to the event data store. Note that for many systems, the adaptive current controller circuitry may be set up to assume that "unknown" current transient signatures could be an indication of a latchup event, requiring a temporary shutdown. For most systems, this "false alarm rate" needs to be minimized, but does not necessarily need to be zero.

In an alternative embodiment, the adaptive current control circuit can identify the occurrence of SEL when the detected signature vector components indicate the occurrence of a current transient having certain characteristics. More particularly SEL can be identified when a magnitude of the power supply current to the protected device changes with time at a rate that meets or exceeds a predetermined threshold and where the change in magnitude of the power supply current also exceeds a predetermined value. Based on system state, when these two criteria are satisfied, the adaptive current controller identifies the occurrence of SEL. In such a scenario, the signature vector components can include a predetermined rate of change in the current supplied to the protected device, and a minimum change in current magnitude, which when present in combination indicate the occurrence of SEL. These signature vector components can be stored in a data store. Alternatively, a conventional data store can be omitted and instead, dedicated analog or digital hardware can be designed to perform the necessary comparison. The dedicated circuit can evaluate the detected signature vector components and respond to the occurrence of specific vector components which are associated with SEL.

BRIEF DESCRIPTION OF THE DRAWINGS

Embodiments will be described with reference to the following drawing figures, in which like numerals represent like items throughout the figures, and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. However, the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

A conventional apparatus for SEL protection can include a current threshold comparator which is used to control a switch. When a current level exceeds a preset level, a power supply voltage is disconnected from a load (e.g., an integrated circuit device). However, these conventional protective devices have only a limited ability to distinguish between normal currents flowing into the target integrated circuit (IC) and abnormal currents associated with SEL. Further, conventional protective devices used for this purpose are known make use of an FET power switch in series with the IC load. Such an arrangement can be effective, but adds a voltage drop to the power bus of the target IC, and the response time may be too slow to adequately protect the target IC from latent damage. To assure minimal risk to a protected device, a power supply voltage should preferably be turned off within approximately 1 microsecond. The importance of a rapid response time is discussed in further detail in the paper "Latent Damage in CMOS Devices From Single-Event Latchup", by Becker, Miyhira, and Johnston (all from NASA-JPL), IEEE Trans on Nuc Sci, December 2002.

Figure 1:
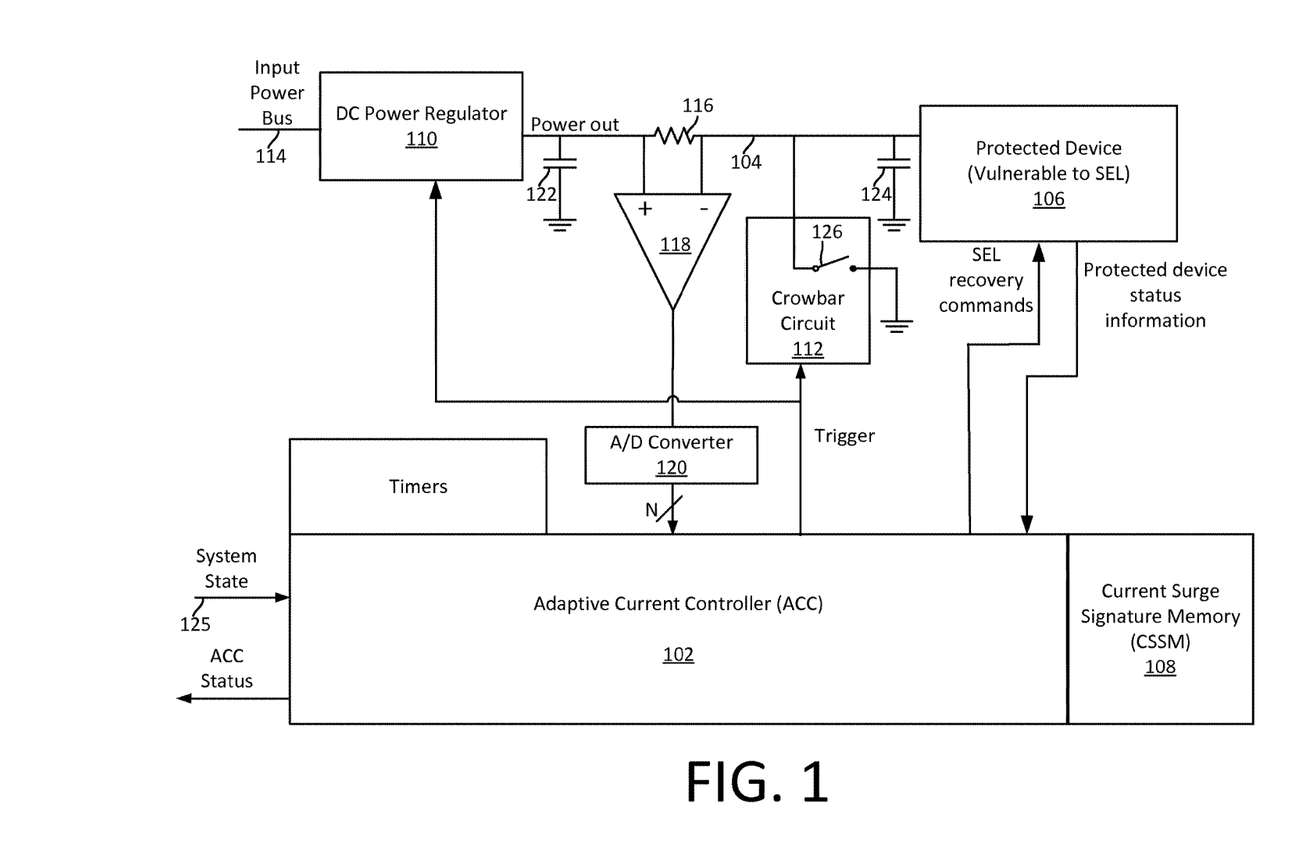
FIG. 1 is a block diagram that is useful for understanding an adaptive surge protection system in accordance with the inventive arrangements.

Referring now to FIG. 1, a system and method is disclosed for mitigating radiation induced SEL. The approach described herein utilizes an adaptive current controller (ACC) 102. The ACC can be trained under controlled conditions to recognize signatures of different types of current surges which can occur on a protected device power bus 104 supplying power to an SEL vulnerable device which is to be protected (e.g., protected device 106). These different types of power surges include standard operation power surges which can and do occur during normal operation of the protected device, and SEL power surges which arise only in connection with an SEL occurrence. Signatures associated with these various types of surges are stored in a Current Surge Signature Memory (CSSM) 108.

Signatures associated with these various types of surges are determined based on one or more signature vectors. Each signature vector is a set of information specifying certain distinguishing characteristics that can be potentially used to distinguish between an SEL condition and normal operation of a protected device. Exemplary signature vectors can include (1) SEL current signal characteristics and features, (2) system state information (3) the logical state of the protected device, and/or (4) environment information. Each signature vector is comprised of one or more signature vector components. For example, an SEL current signal type of signature vector could include signature vector components such as instantaneous current magnitude, current rate of change, information concerning the presence and timing of current signal transients, and so on. Other signature vectors may be comprised of only a single signature vector component. For example, if a signature vector is provided for a logical state of a protected device, then a single signature vector component can be provided to specify whether the device is in an active state or a standby state. The signatures stored in the CSSM allow the ACC to accurately distinguish between standard power surges which occur during normal device operations, and SEL power surges which are associated with an SEL occurrence.

During operation, if the ACC 102 detects a current surge that sufficiently matches a signature of an SEL power surge, or if it detects a surge that does not match a known (non-SEL) surge stored in the CSSM, then the ACC will quickly terminate the application of power to the protected device 106. It accomplishes this result by performing two actions, which can include (1) disabling a DC power regulator 110 that is used as a power source for powering the protected device 106, and (2) triggering a crowbar circuit 112 to thereby clamp protected device power bus 104 at a voltage near ground potential. These actions can be performed concurrently using a common trigger signal as shown.

As shown in FIG. 1, an adaptive current controller system for mitigating radiation induced SEL can include certain components which facilitate monitoring a current flow to a protected device 106 through a protected device power bus 104. Any suitable arrangement can be used to facilitate current sensing. In the embodiment shown in FIG. 1, the current sensing circuit can include a sense resistor 116 which is disposed in series with a protected device power bus 104. The sense resistor can be a relatively small value resistance so as to minimize the voltage drop from the regulator output, and also minimize the impedance from the device power bus 104 to the main bank of bypass capacitors 122. For example, in some embodiments the sense resistor can have a value of approximately 0.04 ohm. Of course, the invention is not limited in this regard and other sense resistor values can be selected for a particular application. Also, it should be appreciated that other current sensing techniques are possible. For example, instead of a sense resistor 116, a current sense transformer or a Hall-effect sensor could instead be used to sense current flow. Current sensing circuits and sensor arrangements are well known in the art and therefore will not be described here in detail. However, it should be appreciated that any suitable current sensing arrangement can be used for the purposes described herein provided that it has a sufficient bandwidth to accurately sense current transients associated with SEL.

The voltage across the sense resistor can be detected by any suitable means. The voltage across the sense resistor will be directly related to the magnitude of the current flowing to the protected device 106. Accordingly, by monitoring the voltage across the sense resistor, an instantaneous indication of current flow to the protected devices can be obtained. According to one aspect of the invention, a differential amplifier 118 is provided to detect the voltage difference across the sense resistor 116. In the embodiment shown in FIG. 1, the output of the differential amplifier is communicated to the input of a high-speed analog-to-digital (A/D) converter 120. The A/D converter receives the analog voltage output of the differential amplifier 118 and converts it to an N-bit digital output signal. The N-bit digital output signal is communicated to an input of the ACC.

The ACC periodically receives the digitized output from A/D converter 120 and uses such information to evaluate the technical characteristics of a current surge. The A/D conversion rate is selected to be sufficiently high such that rapid variations in current during surge events can be detected. For example, the conversion rate of the A/D converter is preferably chosen having a sample rate of at least 10 MHz, for current transient waveforms with 1 microsecond risetimes.

The information the ACC receives from the A/D converter 120 can be combined with the system state 125 and used to determine variations in the electrical current flowing to the protected device 106 based on the voltage variations across the sense resistor 116. Using this information the ACC can determine certain characteristics or vector components of a detected power surge. For example, such information can include instantaneous current magnitude in protected device power bus 104, the rate of change in such current during a surge event, the profile of a variation in current magnitude over a period of time associated with a surge event (i.e., how the current varies over the course of the surge event), and the system state (or state transition) during the a current surge. The ACC can compare this information to signature vector components of one or more current surge signatures stored in CSSM 108 for purposes of determining whether a current surge corresponds to an SEL occurrence.

Additional information is advantageously evaluated by the ACC for the purpose of determining whether a current surge corresponds to an SEL occurrence. For example, such information can include protected device status information. It will be appreciated that different types of current can normally be expected to occur during various different operating associated with the protected device. Accordingly, it is useful for the ACC to consider the operational status of the protected device 106 when attempting to determine whether a current surge corresponds to an SEL occurrence. This information can be provided to the ACC from the protected device 106 as shown in FIG. 1. Other information which can be evaluated by the ACC can include system state information 125 in which the protected device 106 is utilized. Different system conditions are expected to result in the occurrence of various types of power surges, for example during initial power up, mode changes, target acquisition, etc. Accordingly, knowledge of the current system state is useful for evaluating whether a particular current surge is associated with an SEL occurrence.

The ACC compares the information received to the signature vector component data stored in CSSM 108 to determine whether a particular current surge is related to an SEL occurrence. Any suitable method can be used for performing this evaluation. When a surge occurs, the ACC evaluates the received information about the current surge to determine a current surge signature which most closely corresponds to current conditions. If the conditions correspond to an SEL type power surge, or if it detects a surge that does not match a known surge stored in the CSSM, then the ACC generates a triggers signal to the crowbar circuit 112 and the DC power regulator 110 as described above.

It should be appreciated that while use of an A/D converter as described herein is useful to facilitate current sensing, an A/D converter is not always necessary for detecting SEL with respect to some protected devices. For example, in some scenarios, instead of using an A/D converter, an analog comparator circuit can be used to sense the output of amplifier 118. The comparator circuit can be arranged so that it is triggered when the output from amplifier 118 indicates that a current transient has occurred which exceeds a certain specified value (e.g., 80 mA). For certain devices, it can be determined that such transients occur only due to 1 of 2 reasons: (1) an SEL event has occurred, or (2) there has been a commanded system state change, such as a re-configuration. The ACC logic is aware of the system state changes, and can mask off triggering on these expected transients. Consequently, the ACC logic can ensure that the crowbar circuit 112 is only triggered in response to genuine SEL transients. Still, it will be appreciated that such alternative SEL sensing and detection methods will not be suitable for all SEL-vulnerable devices.

If the characteristics associated with an SEL surge are sufficiently distinctive, it will provide a highly recognizable surge signature and the ACC error rate will be very low. Upsets to the analog circuitry and the ACC logic can be sources of false positive detections, although mitigations for these effects can also be implemented using standard techniques. Occasional false positive SEL detections can be tolerated, if the false positive rate is sufficiently low. If relatively slower shutdown times can be tolerated, and if a detected current surge signature indicates with some uncertainty that an SEL possibly has occurred, the ACC could (optionally) command the protected IC device to a low power idle state. Thereafter, if the current increase still persists, then a conclusion may be drawn that SEL must have occurred, in which case power can be removed entirely in the manner described above. If the current increase does not persist, then power cycling is not required and the system can quickly return to normal operation.

The ACC 102 can be any suitable digital and/or analog control logic element that is capable of performing the operations and actions described herein. Accordingly, the ACC 102 can include one or more of a microcontroller, application-specific integrated circuits (ASIC), field-programmable gate array (FPGA), and analog circuitry. Some embodiments may implement certain ACC functions in two or more specific interconnected hardware modules or devices with related control and data signals communicated between and through the modules, or as portions of an application-specific integrated circuit. Thus, the exemplary system is applicable to software, firmware, and hardware implementations.

A crowbar circuit 112 as described herein provides a short circuit or low resistance from the protected device power bus 104 to ground. This is conceptually illustrated in FIG. 1 by a normally open switch 126, which closes when a trigger signal is received from the ACC 102. Closing switch 126 forms a low impedance path from the protected device power bus 104 to ground. The low impedance path quickly prevents an overcurrent condition occurring with respect to the protected device 106, and thereby limits potential damage to the protected device.

Crowbar circuits are well known in the art and therefore will not be described here in detail. However, it will be appreciated by those skilled in the art that two of the most common electronic circuit components which are used to implement the switch 126 in a crowbar circuit 112 are the MOSFET and/or bipolar transistor(s). A MOSFET type crowbar circuit can operate very quickly (e.g. less than 0.2 microseconds after the trigger signal is applied) to drive the power supply voltage on protected device power bus 104 down to a very low level (e.g., approximating ground voltage). Notably, a 0.2 microsecond response time associated with the crowbar circuit 112 can be expected to help prevent latent SEL damage to the protected device, in conjunction with the other ACC circuitry. The total ACC reaction time between the occurrence of the SEL event and shutdown of the power bus should preferably be less than 1 microsecond, as explained in the paper "Latent Damage in CMOS Devices From Single-Event Latchup", by Becker, Miyhira, and Johnston (all from NASA-JPL), IEEE Trans on Nuc Sci, December 2002. Although a MOSFET type crowbar is generally preferred for the purposes of implementing the crowbar circuit 112, it should be understood that the invention is not limited in this regard, and other types of crowbar implementations may be used in some scenarios.

Concurrently disabling DC power regulator 110 can help prevent damage to the DC power regulator and also protects the power source (not shown) or input power bus 114 for the larger system. In this regard it may be noted that a commercially available DC power regulator of the kind described herein is usually protected with an internal current limit. This internal current limiter will be the primary means of protecting the DC power regulator in the event of an SEL occurrence, since the turn-off time of the regulator may be relatively slow.

One or more bypass or filter capacitors 122, 124 can be provided to control electrical noise from the protected device power bus 104. Capacitor 124 represents the high frequency bypass capacitors that can be part of the IC package, or even integrated onto the IC die itself. It will be appreciated that the location of capacitor 124 is such that it actually has the potential to slow down the detection time. In this regard it will be noted that the detection and reaction time is slowed by the magnitude of total capacitance. To achieve fast crowbar pulldown times as described below, capacitor 124 is advantageously selected to be a relatively small value, so that the time constant of the crowbar on resistance and capacitor 124 is small compared to the 1 microsecond total SEL-to-shutdown reaction time of the ACC.

Powering down a protected device unexpectedly can necessitate a device recovery process whereby the protected device is once again powered up for normal operation. Accordingly, after an SEL occurrence which requires disabling power to the protected device 106, one or more recovery commands may be used to facilitate restoration of the protected device to its normal operating mode. For example, consider a scenario where the protected device is a processing element such as a field programmable gate array (FPGA). In such a scenario, the ACC 102 can generate one or more signals or digital commands after an SEL-related power shutdown to facilitate an FPGA system reboot. For convenience, these and other commands associated with recovery of the protected device after system power-down, are referred to herein as SEL recovery commands. The ACC 102 can communicate at the appropriate time one or more such SEL recovery commands to the protected device to reinitiate its fully operational status. In some scenarios a higher-level system controller (not shown in the diagrams) will implement the full SEL recovery process. This could involve resetting data-gathering functions of the mission. The "ACC Status" output from ACC 102 can be used to inform the higher-level system controller of the situation, to determine the optimum recovery procedure.

ACC Training

According to certain aspects of the inventive arrangements described herein, it may be necessary to collect in advance current surge signature information under controlled conditions. This current signature information can include signature vector component data associated with one or more signature vectors as described herein.

The current signature information can be stored and subsequently used by the ACC as described herein to distinguish between normal or standard current surge events and SEL current surges. The collection of such vector component data under controlled conditions is an important step for purposes of obtaining baseline information against which a real time set of detected signature data can be compared. In some scenarios, it may be sufficient to identify and characterize all current surges associated with normal operation of a protected device. Thereafter, any detected current surges having a set of characteristics which do not conform to recognizable normal or standard current surges can be understood to correspond to SEL events. Alternatively (or in addition to characterizing such normal types of current surges), actual SEL events can be triggered under controlled conditions and the resulting current signatures can be characterized using one or more signature vectors. Exemplary processes of collecting signature data associated with normal or standard current surges and SEL current surges will now be described in further detail.

During controlled training of the ACC 102, the signatures of normal or standard current surge events are recorded. More particularly, signature vector components associated with various signature vectors are measured or detected under various normal operating conditions. The vector component information is then stored in a table and associated with that particular type of power surge. A test setup which is the same or similar to the arrangement shown in FIG. 1 can be used to facilitate recording signature vector component data.

During controlled training, standard current surge signature information can be collected for various operating modes or conditions which are normally associated with the protected device 106. Operating modes and/or conditions can include initialize state, standby state, normal operation, transmit mode (in the case of a transceiver) and so on. Controlled evaluation will reveal the occurrence of one or more standard current surge types, each having a well-defined set of signature vector components associated with each signature vector. These signature vector component values can be associated with power surges that occur under certain operating mode or condition. The combination of standard signature vector components associated with standard current surges for each mode or condition are collected stored in a memory or database.

During the controlled training of the ACC 102, the signature vector component data for SEL type power surges can also be collected. As is known, SEL occurrences are caused by an energetic ion depositing an electrical charge in an SEL sensitive location of an integrated circuit die. More particularly, an SEL is typically induced by a charged particle (i.e. an ion) depositing a sufficient charge that activates the SCR latchup structure. To produce an occurrence of SEL under controlled conditions, a sample of the protected device 106 is exposed to energetic ions by using a suitable particle accelerator, such as a cyclotron to bombard the protected device with heavy ions. Alternatively, SEL can be induced in the protected device by using a laser beam. For example, see the paper "SEL-Sensitive Area Mapping and the Effects of Reflection and Diffraction From Metal Lines on Laser SEE Testing", by N. Dodds et al, IEEE Trans Nuc Sci, August 2013. As a result of such exposure, the SEL susceptible protected device 106 can be expected to exhibit SEL, but under a controlled condition. When SEL occurs within the protected device 106, it will produce an SEL induced current surge at the protected device power bus 104. The various signature vector components associated with such SEL induced current surge can be measured and/or detected. The vector component information can then be identified in association with an SEL current surge type and stored in a table or memory.

Signatures Vector Components

As noted above, the signature vector components can include various different technical characteristics which are useful for uniquely identifying a particular current surge type associated with a specific condition. As such, a signature vector component can constitute raw measured data measurements or can include data which has been processed by the ACC to facilitate signature comparison. One example of a signature vector component is current magnitude in a protected device power bus 104. A particular condition (or set of conditions) may cause the magnitude of current flowing in the power bus to increase to a certain value (or exceed a certain value) for some period of time. But current magnitude alone may not be sufficient to differentiate an SEL caused current surge from other types of power surges. Accordingly, it is useful to consider other signature vector components that are useful for characterizing the surge.

A second current surge signature vector component can include a rate of change in the magnitude of current flowing in the power bus associated with a protected device. When a current surge occurs, it is expected that the current magnitude will increase from a normal operating range to a substantially higher value. The instantaneous rate of change in current magnitude versus time during this transition can serve as a useful signature vector component that is indicative with respect to the cause of the power surge. For example, the current rise time on a protected device power bus 104 under conditions associated with SEL type power surges is often faster than other types of power surges which are expected to occur during normal operating conditions.

Current variations in the protected device power bus 104 can be measured indirectly based on the voltage across sense resistor 116. One or more timing circuits or timers 128 can be provided to facilitate such current rate of change measurements. Accordingly, the instantaneous rate of change in current associated with current surge events (standard power surges and SEL power surges) can be measured, characterized and stored as one of the signature vector components described herein. A signature vector component can also specify or otherwise indicate the time it takes for the power bus electric current supplied to the protected device to fully transition from a first current magnitude value associated with a normal (non-power surge) operation of the protected device to a second current magnitude value associated with a current surge condition.

Aside from instantaneous rate of change, it will be appreciated that current magnitude associated with a current surge can vary over time in accordance with a unique pattern or profile. For example, with reference to FIG. 2 it may be observed that an increase in current magnitude can occur linearly 202 or exponentially 204 over time. The increase may exhibit certain break points 206, 208 where changes occur in the rate or profile associated with the increase in current magnitude. The current magnitude may plateau 210 at certain levels before increasing further, tapering 212 or remaining at some peak level. The time duration between occurrences of such events may also be an important signature vector component. Finally, high frequency transient patterns 214 may occur with respect to the current magnitude as it increases from its normal value to its maximum surge value. Accordingly, a further signature vector component can include a single one of these features or a combination of such features. Signature vector components as described herein can facilitate uniquely identifying an SEL current surge versus standard types of power surges that occur during normal operations.

Variations in current magnitude as described herein can be an important indicator for purposes of identifying the underlying cause of a particular current surge. However, to place such information in proper context, it is also valuable for the ACC to have information concerning the operational status of the protected device. Such information can include a temperature of the protected device, the operating mode of the protected device, or any other information or data available from the detected device that is useful for understanding the operational context. This information can be provided to the ACC in the form of other signature vectors comprising other types of signature vector components.

Finally, it will be appreciated that a protected device 106 as described herein will often be included as part of a larger host system that is supported by the protected device. The state of the host system can offer valuable insights into the nature of a particular power surge. For example, in a transceiver system, a protected device 106 may experience different types of current surges during system initiation, standby mode, transmit mode and receive mode. A particular set of signature vector components which are completely normal or expected during one such mode (e.g. transmit mode), may conversely indicate the presence of an SEL event when the host system is operating in a different mode (e.g. a standby mode). So the context of the host system is a further important signature vector component which is evaluated by the ACC 102 when evaluating a current surge event.

Evaluation of Signature Vector Components

Figure 2:
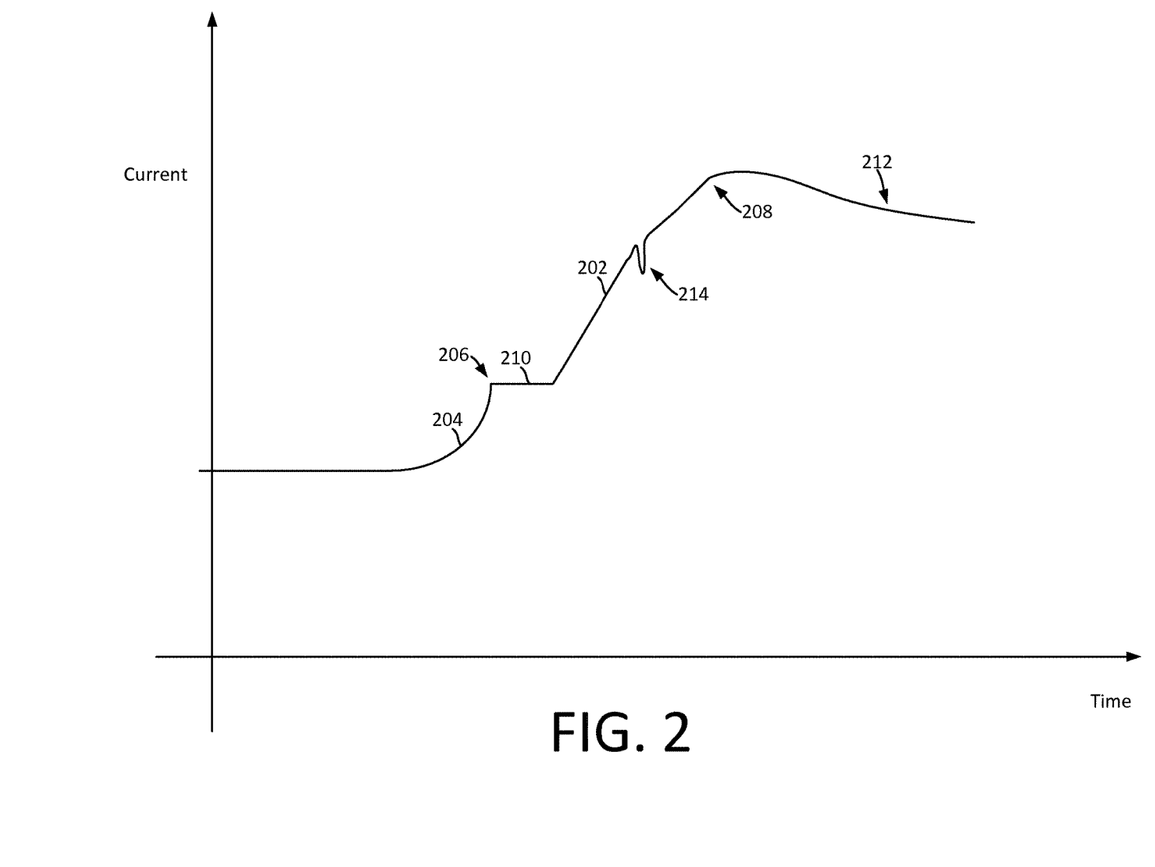
FIG. 2 is an exemplary plot of current versus time that is useful for illustrating certain characteristics that may be present in a time varying signal representing current magnitude.

The ACC 102 can use any suitable method for purposes of evaluating whether a particular set of detected operating parameters correspond to a particular type of current surge event. According to one aspect, the ACC can require that all of the detected signature vector components associated with a plurality of signature vectors match or fall within a range of a set of signature vector components stored in the CSSM 108 before generating a trigger signal to the crowbar circuit 112 and DC power regulator 110. According to a further aspect, the significance of the various signature vectors and/or signature vector components can be weighted in a predetermined manner in accordance with their perceived level of relevance. The set of detected signature vector components could be scored against signature vector component data of previously stored signatures contained in the CSSM 108 to determine the extent to which a currently detected set of signature vector components is correlated to each of a plurality of stored signatures. A sufficiently high correlation with a SEL current surge signature type could then be used as a basis to trigger the crowbar circuit 112 and DC power regulator 110 as described herein. More sophisticated numerical based curve fitting or comparison methods could also be used to compare signature vector components (e.g. signature vector components 202-214) to corresponding sets of stored signature vector components.

According to one aspect of the invention, an SEL current surge can be identified when one or more of the signature vector components indicate that a specific step increase in current flowing to a protected device has occurred. For example, an SEL current surge could be identified where the increase exceeds some predetermined value, or is within some predetermined range. In other scenarios, the SEL current surge can be identified when a minimum predetermined increase in current occurs within some predetermined period of time which is very brief. In still other scenarios, an SEL current surge can be identified when the rate of current change associated with the step increase exceeds some predetermined value, or has certain current profile characteristics. Such signature vector components are advantageously evaluated in conjunction with of other signature vector components such as protected device status, and/or host system status.

The ACC can provide one or more output status indicator signals to reflect its current status to the host system. These status indicator signals can be important for informing the host system that the protected device has experienced an SEL event and has been temporarily powered down. After an SEL occurrence, a power reset may be sufficient to return the protected device to full operational function. Accordingly, the ACC is advantageously arranged to reset the crowbar circuit and DC power regulator to their normal operating mode after some brief power reset time. This reset operation can involve opening switch 126 and once again enabling output power from the DC power regulator 110. In the event of a protected device being powered down, the host system may need to re-load certain data or operating instructions to reinitiate operation of the protected device. For some systems, power supply sequencing must be managed by the host system, to prevent possible damage. Accordingly, the ACC status indicator can also indicate when power has been restored to the protected device so that the necessary data or operating instructions can be loaded at that time.

Figure 3:
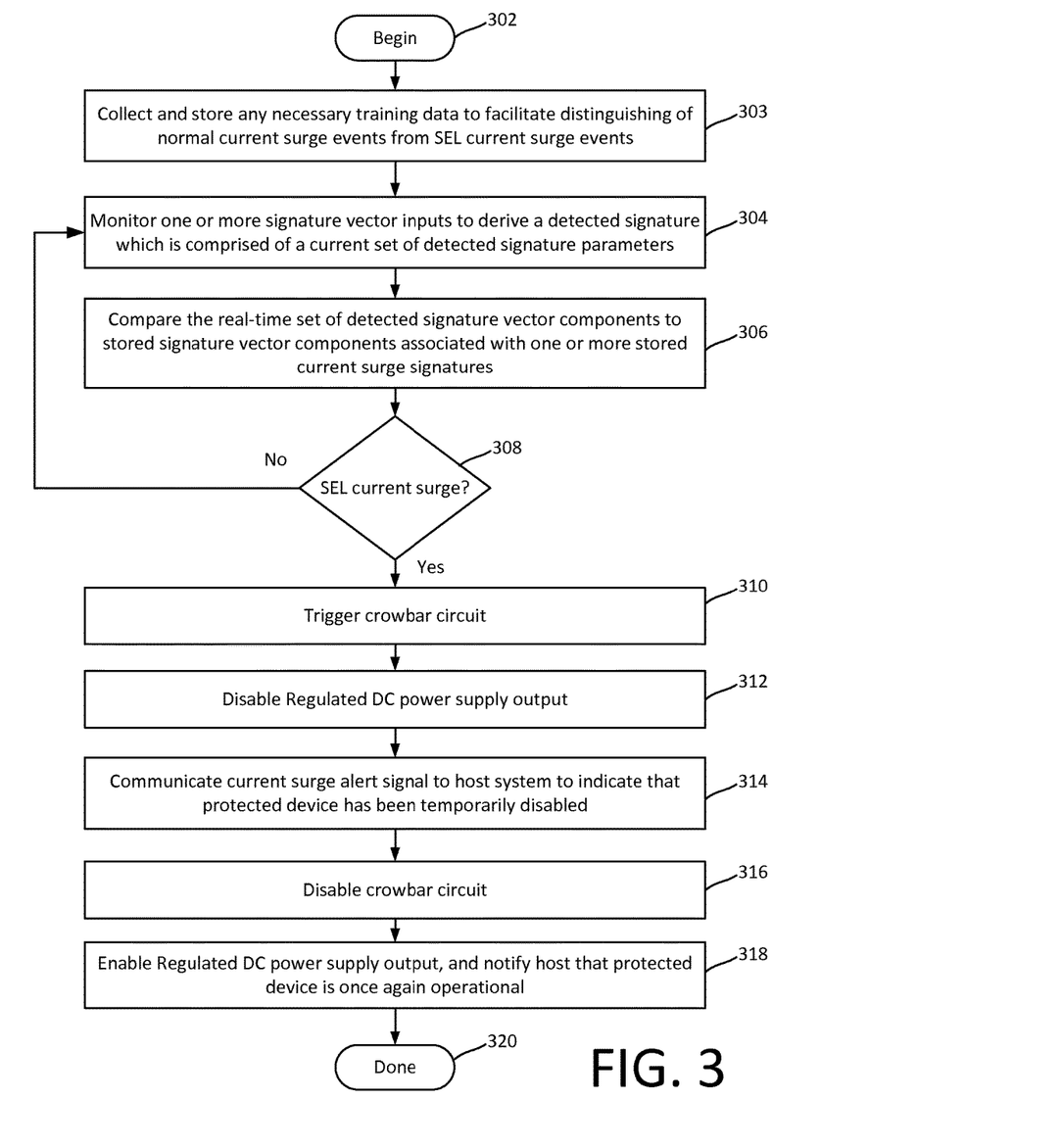
FIG. 3 is a flowchart that is useful for understanding a method for adaptive surge protection.

A flowchart is shown in FIG. 3 which is useful for understanding a method or process for adaptive current control to protect against SEL occurrences. The process begins at 302. At step 303 any necessary training data is collected and then stored to facilitate the ability to distinguish normal or standard current surge events from SEL current surge events. Once this data has been collected for different types of current surge events under controlled conditions, the process can continue on to 304 where one or more signature vector inputs are monitored by ACC 102 to derive a detected signature which is comprised of a current set of detected signature vector components. These detected signature vector components can include real-time information as described above concerning current flow to a protected device 106. The detected signature vector components can also include status information pertaining to the protected device and the host system in which the protected device is installed. At 306, the real-time set of detected signature vector components are compared by the ACC to stored signature vector components associated with one or more stored current surge signatures. Based on the comparison, a determination is made at 308 as to whether an SEL based current surge has occurred. This step can also include a determination that a non-SEL based current surge has occur. If no SEL current surge has occurred (308: No) then the ACC can continue monitoring signature inputs. However, if an SEL current surge is detected (308: Yes), then a trigger is initiated at 310 to activate crowbar circuit 112. The output of DC power regulator 110 is concurrently disabled at 312. Further, an SEL current surge alert signal can be communicated to a host system at 314 as an indication that the protected device has been temporarily disabled.

Once the power applied to the protected device 106 has been disabled as described herein, the protected device should unlatch, and power can be restored. For some systems, the unlatching will occur as part of a full power cycle of the system, so that power sequencing rules can be followed. This process of disabling and then re-applying power is sometimes referred to herein as cycling the power applied to the protected device. At 316 the crowbar circuit 112 can be disabled after a brief period of time so that the power input to the protected device is no longer connected to ground though the low impedance path. Once the crowbar circuit is disabled at 316, the DC regulated power supply can also be re-enabled at 318 so that it once again supplies power to the protected device. Concurrently, a re-initiate signal can be sent at from the ACC 102 to the host system to indicate that power has been restored to the protected device. The host system can optionally use this signal as an indication that the protected device is ready to function or ready to receive initiation commands and/or data. The process then terminates at 320 or returns to 304 so that monitoring can continue.

From the foregoing discussion, it will be understood that various types of detected signature vectors comprising various signature vector components can be used to identify the occurrence of an SEL. With certain types of protected devices, an occurrence of SEL can be accurately identified based on specific vector components, including the system and device state, and the a rate of change and change in magnitude of a power supply current into a protected device power supply bus 104. In such a scenario, a combination of these power and state vector components can be thought of as the detected signature.

Figure 4:
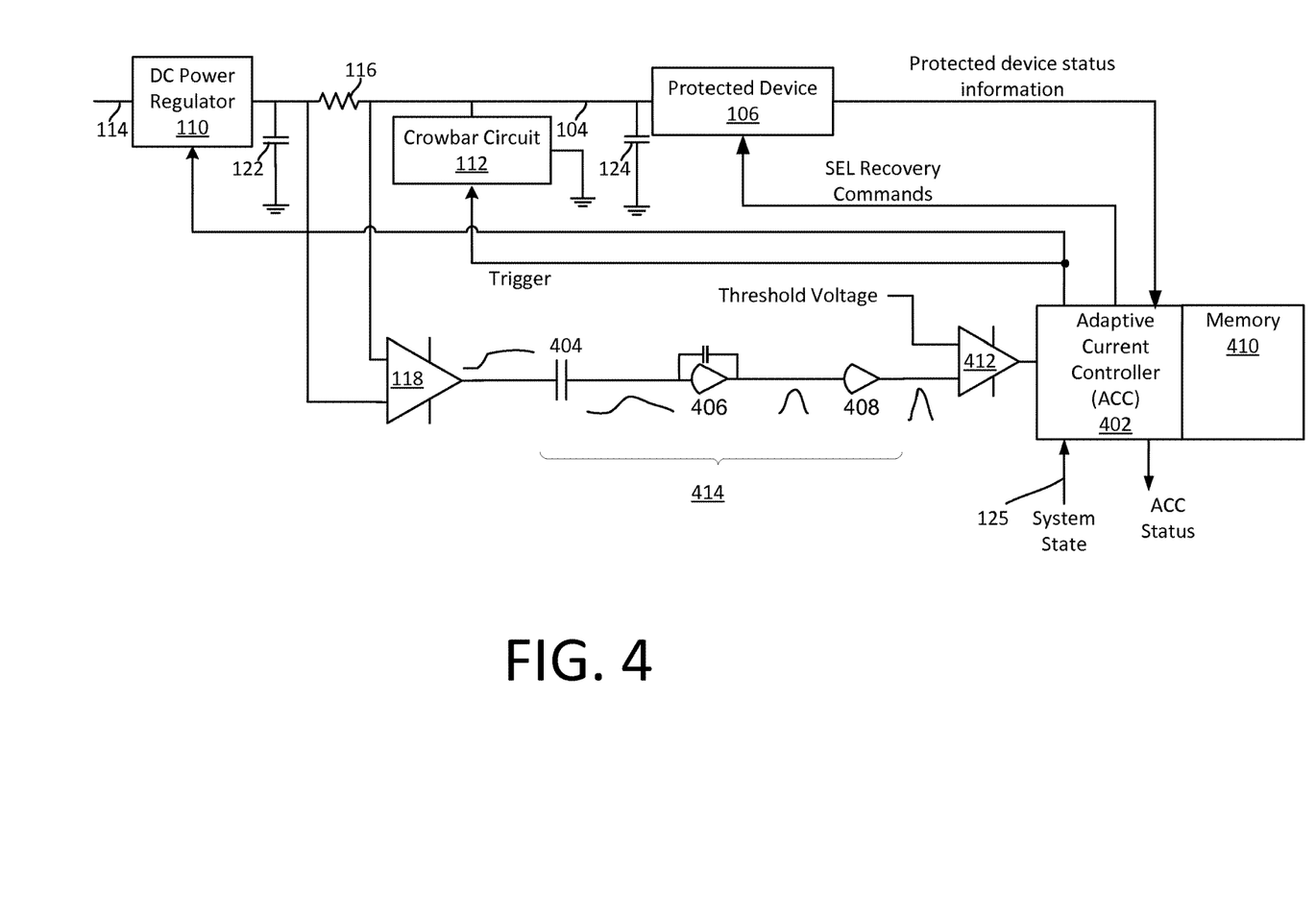
FIG. 4 is a block diagram that is useful for understanding an alternative embodiment of an adaptive current controller in accordance with the inventive arrangements.

Referring now to FIG. 4, there is shown an alternative embodiment of an adaptive surge protection system which can be used to identify SEL based on system state, plus the change in current magnitude and rate of change. The system shown in FIG. 4 is similar to the system shown in FIG. 1 in some respects. Accordingly, it can be observed that the system in FIG. 4 includes certain components which facilitate monitoring a current flow to a protected device 106 through a protected device power bus 104. As with the system shown in FIG. 1, any suitable arrangement can be used to facilitate current sensing. In the embodiment shown in FIG. 4, the current sensing circuit includes a sense resistor 116 which is disposed in series with a protected device power bus 104. One or more bypass or filter capacitors 122, 124 are provided to control electrical noise from the protected device power bus 104. The system in FIG. 4 also includes a differential amplifier 118 to detect the voltage difference across the sense resistor 116, and a crowbar circuit 112 which is similar to the crowbar circuit shown and described with respect to FIG. 1.

In FIG. 4, the output of the differential amplifier circuit 118 is coupled to a DC blocking capacitor 404. A second terminal of the DC blocking capacitor is coupled to the input of a pulse forming integrator 406. The output of the pulse forming integrator is coupled to a signal amplifier 408, which provides an amplified output signal to a high speed comparator 412. The combination of the blocking capacitor 404, the pulse forming integrator 406 and the signal amplifier 408 comprise a signal conditioning circuit 414. The signal conditioning circuit processes output signals received from differential amplifier 118 to facilitate comparison of certain detected current surge signature vector components to a plurality of previously determined signature vector components. The comparison of the two detected vector components (current magnitude and rate of change) to a plurality of predetermined signature vector components occurs concurrently at a voltage comparator 412.

In the circuit shown in FIG. 4, the differential amplifier 118 will output current signature vectors which can be characterized by two or more detected signature vector components. When an SEL event occurs in the protected device 106, it will produce a current signature at the output of differential amplifier 118. For example, the current signature vector will indicate a rapid rise in current in accordance with a known rate of change, and will indicate a change in current magnitude (after the rapid increase) which exceeds some predetermined amount. When these current conditions are detected, the controller logic 402 can further utilize system state information to determine with high reliability that an SEL event has occurred.

In order to detect the presence of SEL in this embodiment, the output signal from the differential amplifier 118 is coupled to the pulse forming integrator 406 through the DC blocking capacitor 404. The DC blocking capacitor strips the DC portion of the signal away to ensure that the signal that is passed is representative of the delta current (change in current), independent of the starting DC current value. The DC blocking capacitor also functions as a very low frequency cutoff filter which performs an averaging function. After passing through the DC blocking capacitor, the signal is passed to the pulse forming integrator 406 which converts the delta current signal to a pulsed signal. The pulsed signal will have a pulse amplitude that is proportional to the magnitude and rate of change in current indicated by the output from the differential amplifier 118. Once the pulsed signal is generated at 406, it can be passed to a signal amplifier 408 for amplification.

The pulsed signal output from signal amplifier 408 is subsequently compared to a threshold voltage at high speed comparator 412. The output of the high speed comparator 412 goes from low to high when the magnitude of the pulsed output of signal amplifier 408 exceeds a threshold reference voltage value, which value may be programmable. This comparator output signal is then used to signal supporting firmware in the ACC 402 that an event of suitable speed and magnitude correlating to a probable latchup event has occurred. The firmware, which can be stored in memory 410, will determine if the current increase was expected or anticipated based upon the current operating state of the protected device, and/or system state. If the current increase was not expected based on current known operating conditions, then the firmware activates a crowbar circuit 112, and disables the DC power regulator 110.

In some scenarios, a pulse width discriminator circuit (not shown) can be provided in in FIG. 4 to evaluate a width of pulses output from the signal amplifier 408 and to selectively pass only those pulses having a pulse width within a particular range. For example, such circuitry could be designed to pass on to comparator 412 only those pulses having a predetermined duration. Pulse width discriminator circuits as described herein are well known in the art and therefore will not be described in detail. However, it will be appreciated that such an arrangement could be used to effectively mask pulses output from the signal amplifier 408 that are of such short duration so as to indicate that they are merely transient noise and can be safely ignored.

In the embodiment in FIG. 4, the detected current signature vector components include a current rate of change and a current magnitude in sense resistor 116. An SEL signature in such a scenario can include a current rate of change which exceeds some predetermined value, and a current magnitude which also exceeds some predetermined magnitude. In the embodiment shown, these two vector components are concurrently evaluated in comparator 412 after suitable analog circuit conditioning of the current sensing signal. When a presence of these two detected signature vector components is identified concurrently, the ACC can use other signature vectors comprising other signature vector components (such as system state information) to determine with a high degree of reliability that SEL has occurred in the protected device.

The inventive arrangements have been described herein with reference to differentiating SEL type power surges from other types of power surges. However, it should be understood that the invention is not limited in this regard. The inventive techniques described herein can be applied in any case where it is advantageous to differentiate between the occurrence of standard power surges associated with normal operation of a protected device and other types of power surges. The invention is particularly useful for differentiating standard power surges from non-standard power surges (such as power surges associated with SEL) where the current surge indicates a need to cycle power of the protected device to ensure its continued proper functioning.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

We claim:

1. A method for SEL mitigation, comprising:
monitoring a plurality of signature vectors for a protected device;
deriving from the plurality of signature vectors a detected signature which is comprised of a plurality of detected signature vector components;
comparing the plurality of detected signature vector components to a plurality of previously determined signature vector components, where at least one of said previously determined signature vector components comprises (a) a logical state of the protected device or (b) environment information;
based on the comparing step, selectively differentiating between the occurrence of standard current surges associated with normal operation of the protected device and a non-standard current surge which requires cycling power to the protected device for continued proper functioning of the protected device; and
using a common trigger signal to (A) disable a power source and (B) clamp at least one power bus supplying power to the protected device at a voltage near ground potential, based on the results of the comparing step.

2. The method according to claim 1, further comprising selecting the plurality of detected signature vector components to include at least one which specifies an operating condition of the protected device from among a plurality of different operating conditions.

3. The method according to claim 1, further comprising selecting the plurality of detected signature vector components to include at least one which specifies an operating mode of a host system in which the protected device is installed.

4. The method according to claim 1, further comprising selecting the plurality of detected signature vector components to include a rate of change in a power bus electric current supplied to the protected device.

5. The method according to claim 1, further comprising selecting the plurality of detected signature vector components to include a current profile of a power bus electric current supplied to the protected device, the current profile specifying at least one characteristic of a time varying power bus electric current supplied to the protected device over a period of time during which the electric current transitions from a normal operating condition of the protected device to a current surge condition.

6. The method according to claim 1, further comprising selecting the detected signature vector components to include a duration of time required for a power bus electric current supplied to the protected device to fully transition from a first current magnitude value associated with a normal operation of the protected device to a second current magnitude value associated with a current surge condition.

7. The method according to claim 1, wherein the at least one power supplying bus is clamped by triggering a crowbar circuit to form a low impedance path from a power input of the protected device to said ground potential.

8. A method for SEL mitigation, comprising:
monitoring a plurality of signature vectors for a protected device;
deriving from the plurality of signature vectors a detected signature which is comprised of a plurality of detected signature vector components;
comparing the plurality of detected signature vector components to a plurality of previously determined signature vector components, where at least one of said previously determined signature vector components comprises (a) a logical state of the protected device or (b) environment information;
based on the comparing step, selectively differentiating between the occurrence of standard current surges associated with normal operation of the protected device and a non-standard current surge which requires cycling power to the protected device for continued proper functioning of the protected device;
selectively cycling at least one power bus supplying power to the protected device, based on the results of the comparing step;
selectively cycling the power applied to the protected device by triggering a crowbar circuit to form a low impedance path from a power input of the protected device to a ground potential; and concurrent with triggering the crowbar circuit, disabling a DC power regulator circuit which supplies power to the protected device.

9. A current surge mitigation system for ensuring reliable operation of a protected device, comprising:
an electronic system configured to protect a protected device which has a known vulnerability to certain types of events which result in excessive current surges;
an adaptive current control circuit which monitors a plurality of signature vectors for the protected device and derives from the plurality of signature vectors a detected signature which is comprised of a plurality of detected signature vector components;
a sensing circuit which senses a magnitude of an electric power current supplied to the protected device on a power bus and communicates at least one said signature vector to the adaptive current controller which is representative of the magnitude;
wherein the adaptive current control circuit
compares the plurality of detected signature vector components to a plurality of predetermined signature vector components, where at least one of said previously determined signature vector components comprises (a) a logical state of the protected device or (b) environment information, and
based on the comparing, selectively differentiates between the occurrence of a standard current surge associated with normal operation of the protected device and a non-standard current surge which requires cycling power of the protected device for continued proper functioning of the protected device;
wherein at least one output circuit of said adaptive current control circuit selectively generates a trigger signal for cycling the power applied to the protected device when a non-standard current surge is identified; and
wherein the trigger signal is used to (A) disable a power source and (B) clamp at least one power bus supplying power to the protected device at a voltage near ground potential.

10. The system according to claim 9, wherein the plurality of detected signature vector components include at least one which specifies an operating condition of the protected device from among a plurality of different conditions.

11. The system according to claim 9, wherein the plurality of detected signature vector components includes at least one which specifies an operating mode of a host system in which the protected device is installed.

12. The system according to claim 9, wherein the plurality of detected signature vector components include a rate of change in a power bus electric current supplied to the protected device.

13. The system according to claim 9, wherein the at least one power supplying bus is clamped by triggering a crowbar circuit to form a low impedance path from a power input of the protected device to said ground potential.

14. A current surge mitigation system for ensuring reliable operation of a protected device, comprising:
an electronic system for protecting a protected device which has a known vulnerability to certain types of events which result in excessive current surges;
an adaptive current control circuit which monitors a plurality of signature vectors for the protected device and derives from the plurality of signature vectors a detected signature which is comprised of a plurality of detected signature vector components;
a sensing circuit which senses a magnitude of an electric power current supplied to the protected device on a power bus and communicates at least one said signature vector to the adaptive current controller which is representative of the magnitude;
wherein the adaptive current control circuit
compares the plurality of detected signature vector components to a plurality of predetermined signature vector components, where at least one of said previously determined signature vector components comprises (a) a logical state of the protected device or (b) environment information, and
based on the comparing, selectively differentiates between the occurrence of a standard current surge associated with normal operation of the protected device and a non-standard current surge which requires cycling power of the protected device for continued proper functioning of the protected device;
wherein at least one output circuit of said adaptive current control circuit which selectively generates a trigger signal for cycling the power applied to the protected device when a non-standard current surge is identified;
wherein the at least one output circuit generates a trigger signal which triggers a crowbar circuit to form a low impedance path from a power input of the protected device to a ground potential; and
wherein concurrent with triggering the crowbar circuit, the at least one output circuit also disables a DC power regulator circuit which supplies the power to the protected device.

15. A method for current surge mitigation, comprising:
monitoring at least one signature vector for a protected device;
deriving from the at least one signature vector a detected signature which is comprised of at least one detected signature vector component;
comparing the at least one detected signature vector component to one or more predetermined signature vector components, where said one or more predetermined signature vector components comprises (a) a logical state of the protected device or (b) environment information;
based on the comparing step, selectively differentiating between the occurrence of a standard current surge associated with normal operation of the protected device and a non-standard current surge which requires cycling power of the protected device for continued proper functioning of the protected device; and
using a common trigger signal to (A) disable a power source and (b) clamp at least one power bus supplying power to the protected device at a voltage near ground potential, when the non-standard current surge is identified;
wherein the at least one detected signature vector component indicates a rate of change of an electric power current supplied to the protected device.

16. The method according to claim 15, wherein the at least one detected signature vector component indicates a duration of time required for the electric power current to fully transition from a first current magnitude value associated with a normal operation of the protected device to a second current magnitude value associated with a current surge condition.

17. The method according to claim 15, wherein the at least one detected signature vector component includes at least a second detected signature vector component which specifies an operating condition of the protected device from among a plurality of different operating conditions.

18. The method according to claim 15, further comprising selecting the at least one detected signature vector component to include at least one which specifies an operating mode of a host system in which the protected device is installed.

19. The method according to claim 15, wherein the at least one power supplying bus is clamped by triggering a crowbar circuit to form a low impedance path from a power input of the protected device to said ground potential.

20. A method for current surge mitigation, comprising:
monitoring at least one signature vector for a protected device;
deriving from the at least one signature vector a detected signature which is comprised of at least one detected signature vector component;
comparing the at least one detected signature vector component to one or more predetermined signature vector components, where said one or more predetermined signature vector components comprises (a) a logical state of the protected device or (b) environment information;
based on the comparing step, selectively differentiating between the occurrence of a standard current surge associated with normal operation of the protected device and a non-standard current surge which requires cycling power of the protected device for continued proper functioning of the protected device;
selectively cycling the power applied to the protected device by triggering a crowbar circuit to form a low impedance path from a power input of the protected device to a ground potential; and
concurrent with triggering the crowbar circuit, disabling a DC power regulator circuit which supplies the power to the protected device;
wherein the at least one detected signature vector component indicates a rate of change of a electric power current supplied to the protected device.

* * * * *